US006950957B1

(12) United States Patent
O'Leary

(10) Patent No.: US 6,950,957 B1
(45) Date of Patent: Sep. 27, 2005

(54) PHASE COMPARATOR FOR A PHASE LOCKED LOOP

(75) Inventor: William O'Leary, Plano, TX (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 812 days.

(21) Appl. No.: 09/659,235

(22) Filed: Sep. 11, 2000

(51) Int. Cl.$^7$ ............................................... G06F 1/04
(52) U.S. Cl. ..................................... 713/401; 713/503
(58) Field of Search ............................... 713/400–600

(56) References Cited

U.S. PATENT DOCUMENTS

| | | | |
|---|---|---|---|
| 4,847,678 A * | 7/1989 | McCauley | 348/537 |
| 5,239,561 A | 8/1993 | Wong et al. | |
| 5,373,255 A | 12/1994 | Bray et al. | |
| 5,376,847 A | 12/1994 | Staszewski | |
| 5,726,607 A | 3/1998 | Brede et al. | |
| 5,727,193 A * | 3/1998 | Takeuchi | 713/501 |
| 5,734,273 A | 3/1998 | Mudd | |
| 5,778,214 A * | 7/1998 | Taya et al. | 713/400 |
| 5,790,614 A | 8/1998 | Powell | |
| 5,990,673 A | 11/1999 | Forsberg | |
| 5,991,350 A * | 11/1999 | Yamamoto | 375/376 |
| 6,064,273 A | 5/2000 | Donohue | |
| 6,108,794 A * | 8/2000 | Erickson | 713/401 |
| 6,487,672 B1 * | 11/2002 | Byrne et al. | 713/400 |
| 6,654,897 B1 * | 11/2003 | Dreps et al. | 713/401 |

OTHER PUBLICATIONS

Steven L. Maddy, "Phase-Locked Loop", *The Electrical Engineering Handbook* [Computer File], Chapter 76, 1999.
Dan H. Wolaver, "Phase Locked Loop Basics", "Loop Filters", "Phase Detectors", *Phase-Locked Loop Circuit Design*, Chapter 2, 3 and 4, pp. 9-79, Prentice Hall, 1991.

* cited by examiner

*Primary Examiner*—Dennis M. Butler
(74) *Attorney, Agent, or Firm*—Fogg and Associates, LLC; David N. Fogg

(57) ABSTRACT

Phase locked loops operable at low reference clock signal frequencies include a phase comparator having a phase detector, a digital counter, and a digital-to-analog converter. The phase detector provides an error signal indicative of a phase relationship between the reference clock signal and a feedback signal. The digital counter provides a count value indicative of the amount of phase error between the reference clock signal and the feedback signal. The digital-to-analog converter provides an error voltage signal proportional to the count value. Such phase comparators permit direct measurement of the amount of phase error prior to filtering and amplification by the phase locked loop. Direct measurement of the amount of phase error can be used to reduce the likelihood of saturating an amplifier of an active filter of the phase locked loop without the use of a pre-filter. Such phase locked loops are suitable for use in timing circuits of communications systems.

66 Claims, 6 Drawing Sheets

US 6,950,957 B1

PHASE COMPARATOR FOR A PHASE LOCKED LOOP

TECHNICAL FIELD

The present invention relates generally to the field of communication systems and, in particular, to systems for establishing a timing signal from a low-frequency reference clock signal.

BACKGROUND

Communications systems generally require that the operation of synchronous transmission elements within the system be coordinated to some timing signal derived from a reference clock signal. The derived timing signal is synchronized, or locked, to the reference clock signal. One well-known clock synchronization technique is the use of a phase locked loop (PLL).

A PLL is a frequency-selective circuit generally containing a phase comparator, a low-pass filter, and a voltage-controlled oscillator (VCO) coupled in a feedback arrangement. When an input or reference clock signal is applied to the PLL, the phase comparator compares the phase of the reference clock signal with the phase of the VCO output signal and generates an error signal that is related to the phase relationship between the two signals. This error signal is filtered, amplified, and applied to the VCO, thus driving the frequency of the VCO output signal in a direction to more closely align its phase to that of the reference clock signal. When the VCO output frequency is sufficiently close to the reference frequency, the feedback nature of the PLL causes the VCO output to lock to the reference clock signal frequency, with the exception of some finite phase difference. The point is called "zero phase error." While the phases may not be aligned, their frequencies are matched such that the amount of phase difference remains substantially constant. The self-correcting nature of the PLL thus allows the system to track the frequency changes of the reference clock signal once it is locked. A frequency divider is often inserted in the feedback loop when the desired output frequency of the VCO is a selected multiple of the reference clock signal frequency.

FIG. 1 is a schematic of a typical PLL 100. The PLL 100 includes a phase comparator 110 having a first input for the reference clock signal and a second input for the feedback signal. Phase comparator 110 is shown to include simply an XOR logic gate for detection of the phase difference. The output of the phase comparator 110 is coupled to the input of a filter 120. The output of the filter 120 is coupled to the input of a VCO 130 for providing the control voltage to the VCO 130. The output of the VCO 130 is fed back to the second input of the phase comparator 110 through a frequency divider 140.

The filter 120 is shown to have a passive pre-filter 150 coupled in series with an active filter 160. The passive pre-filter 150 is generally an RC filter. The active filter 160 often includes an operational amplifier (op-amp) 170 configured as an integrator combined with a lead network (as shown). The active filter 160 could also be configured as an integrator combined with a lead/lag network by adding an additional capacitive component in parallel with the resistive component in the negative feedback loop. The pre-filter 150 is generally incorporated in PLLs of the type shown in FIG. 1 to avoid saturating the op-amp 170 of the active filter 160. The saturation potential results from the rectangular-wave output of the XOR phase detector of the phase comparator 110. However, as the frequency of the reference clock signal decreases, the amount of pre-filtering required generally increases. At low PLL bandwidths, pre-filtering of the reference clock becomes impractical, with the presence of the carrier (or clock) either causing the PLL to operate with unacceptable noise levels (known as Spurious Modulation) or, in the extreme case, not at all.

For the reasons stated above, and for other reasons stated below which will become apparent to those skilled in the art upon reading and understanding the present specification, there is a need in the art for alternative systems capable of establishing a communications timing signal from a low-frequency reference clock signal.

SUMMARY

The above-mentioned problems with communications systems and other problems are addressed by the present invention and will be understood by reading and studying the following specification.

Various embodiments of the invention pertain to phase locked loops operable at low reference clock signal frequencies. These phase locked loops include a phase comparator having a phase detector, a digital counter, and a digital-to-analog converter. Such phase comparators permit direct measurement of the amount of phase error between a reference clock signal and a feedback signal prior to filtering and amplification by the phase locked loop. Direct measurement of the amount of phase error can be used to reduce the likelihood of saturating an amplifier of an active filter of the phase locked loop without the use of a pre-filter. Such phase locked loops are suitable for use in timing circuits of communications systems.

For one embodiment, the invention provides a phase locked loop. The phase locked loop includes a phase comparator, a filter and a voltage-controlled oscillator. The phase comparator includes a phase detector having a first input for receiving a first reference clock signal, a second input for receiving a feedback signal, and an output for providing an error signal. The phase comparator further includes a digital counter having a first input for receiving the error signal, a second input for receiving a sampling clock signal, and an output for providing a count value. The phase comparator still further includes a digital-to-analog converter having an input for receiving the count value and an output for providing an error voltage signal. The filter has an input for receiving the error voltage signal and an output for providing a control voltage signal. The voltage-controlled oscillator has an input for receiving the control voltage signal and an output for providing an output signal. The feedback signal is derived from the output signal.

For another embodiment, the invention provides a shelf controller for controlling synchronization of shelf elements in a communications network element. The shelf controller includes a processor and a timing circuit coupled to the processor. The timing circuit includes a first phase locked loop including a phase comparator, a filter and a voltage-controlled oscillator. The phase comparator includes a phase detector having a first input for receiving a first reference clock signal, a second input for receiving a feedback signal, and an output for providing an error signal. The phase comparator further includes a digital counter having a first input for receiving the error signal, a second input for receiving a sampling clock signal, and an output for providing a count value. The phase comparator still further includes a digital-to-analog converter having an input for receiving the count value and an output for providing an error voltage signal. The filter has an input for receiving the error voltage signal and an output for providing a control voltage signal. The voltage-controlled oscillator has an input for receiving the control voltage signal and an output for providing an output signal. The feedback signal is derived from the output signal. The timing circuit may further include a second phase locked loop having an input for receiving the second reference clock signal and an output for providing a synchronization timing signal for the synchronization of the shelf elements, wherein the synchronization timing signal is derived from the second reference clock signal.

For yet another embodiment, the invention provides a method of generating a timing signal. The method includes generating an error signal indicative of the phase relationship between a reference clock signal and a feedback signal, generating a count value indicative of the amount of phase error during a single event, generating an error voltage signal proportional to the count value, and filtering the error voltage signal to produce a control voltage signal. The method further includes generating the timing signal in response to the control voltage signal, and deriving the feedback signal from the timing signal.

The invention further provides apparatus, systems and methods of varying scope.

DETAILED DESCRIPTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical, or mechanical changes may be made without departing from the scope of the present invention. The following detailed description is, therefore, not to be taken in a limiting sense, and the scope of the present invention is defined only by the appended claims and equivalents thereof.

Figure 1:
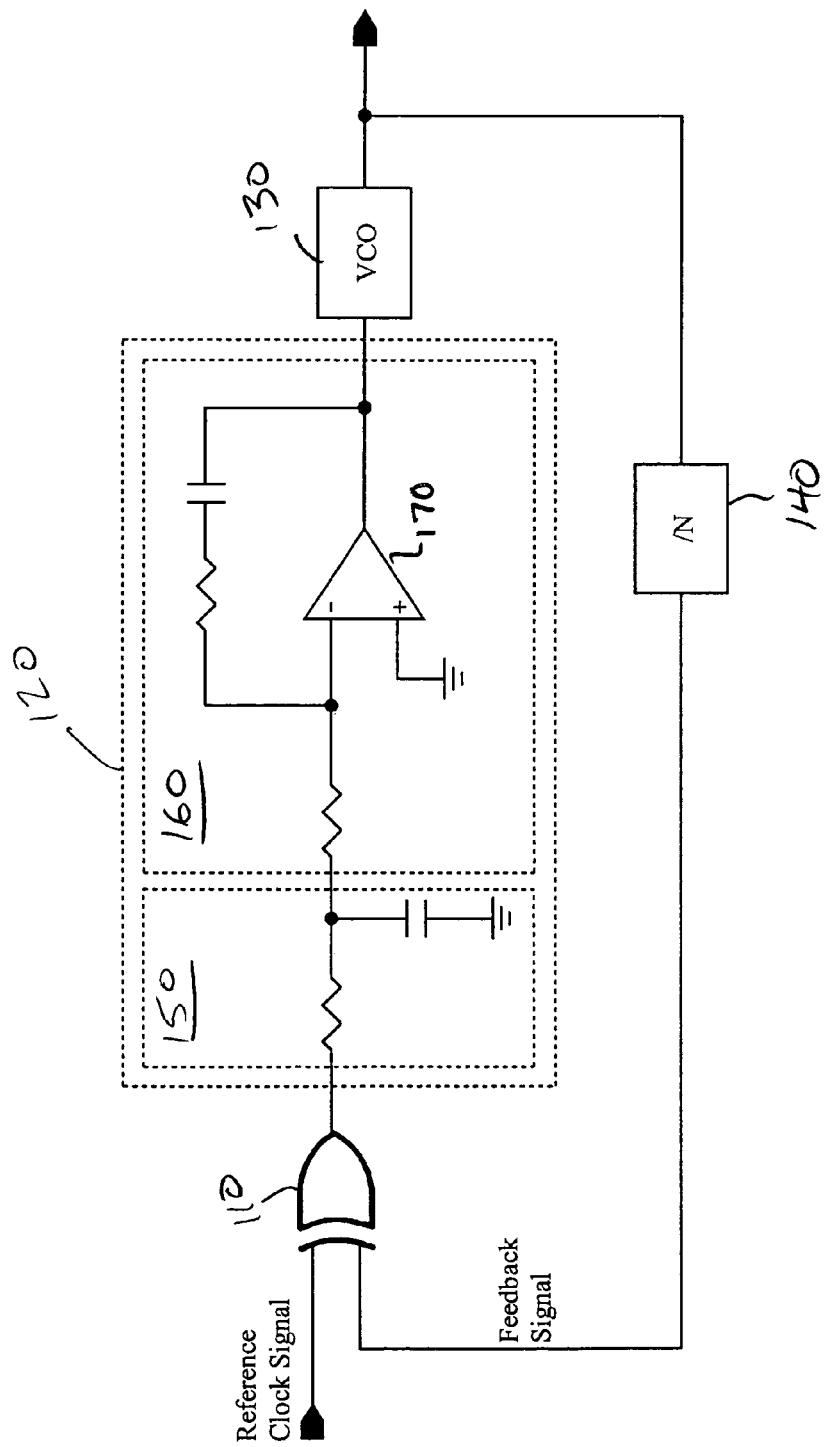
FIG. 1 is a schematic of a typical phase locked loop.

In phase locked loops (PLLs) of the type described with reference to FIG. 1, the pre-filter 150 has the effect of producing an output signal that tends to approximate an average value of the output of the phase comparator 110, where the average value of the output of the phase comparator 110, i.e., the output of the XOR phase detector, is proportional to the amount of phase error between the reference clock signal and the feedback signal. However, as the frequency of the output signal of the phase comparator 110 decreases (resulting from a decrease in the frequency of the reference clock signal), the pre-filter 150 has more time to assume a steady-state operation such that its resulting output signal begins to take on the characteristics of a rectangular wave. It is this rectangular wave as an input to the active filter 160 that may saturate the op-amp 170 by rapidly driving the op-amp 170 from rail to rail. Improved operation may be obtained by providing an input signal to the active filter 160 that is proportional to the amount of phase error.

Figure 2:
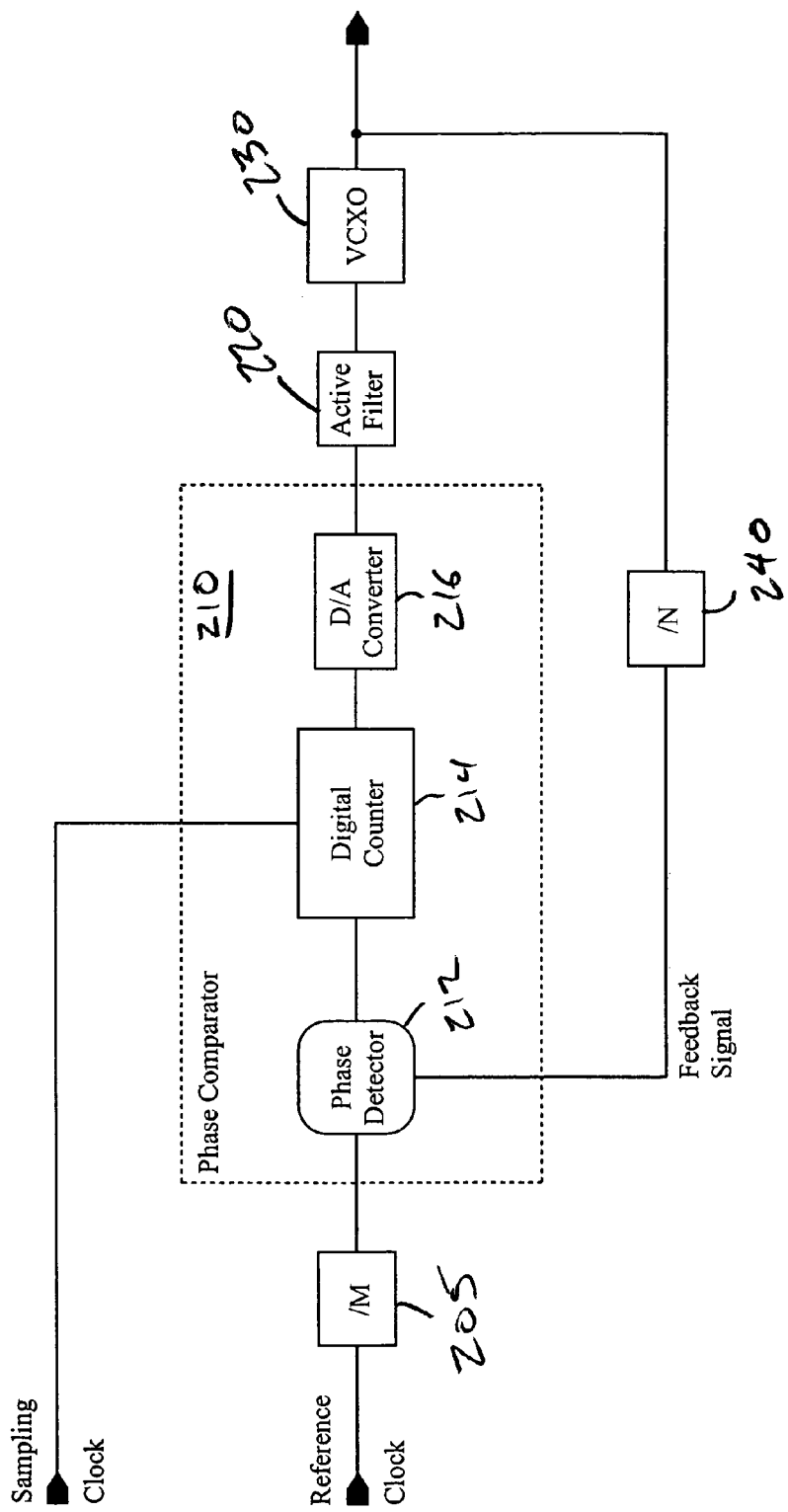
FIG. 2 is a schematic of a phase locked loop in accordance with an embodiment of the invention.

FIG. 2 is a schematic of a PLL 200 in accordance with one embodiment of the invention. The PLL 200 provides an input signal to its filter stage that is proportional to the amount of phase error between the reference clock signal and the feedback signal without the need for pre-filtering.

The PLL 200 includes a phase comparator 210, an active filter 220 and a voltage-controlled oscillator (VCO), such as a voltage-controlled crystal oscillator (VCXO) 230, coupled in series. The phase comparator 210 has a first input for receiving the reference clock signal, and a second input for receiving the feedback signal derived from the output signal of the VCXO 230. The feedback signal may be the output signal of the VCXO 230 when the frequency of the output signal is substantially similar to the frequency of the reference clock signal, or it may be the output signal of the VCXO 230 divided by a selected factor to produce a feedback signal having a frequency substantially similar to the frequency of the reference clock signal.

The phase comparator 210 includes a phase detector 212, a digital counter 214, and a digital-to-analog converter 216 coupled in series. The phase detector 212 receives the first and second inputs of the phase comparator 210 for detection of the phase error between the reference clock signal and the feedback signal. The phase detector 212 outputs an error signal indicative of the phase relationship of the two input signals. For one embodiment, the phase detector 212 is an XOR logic gate or other two-state phase detector, such as a sequential phase detector, providing an error signal having a first logic state when the phases of the two input signals are offset and having a second logic state when the phases of the two input signals share the same state.

It is generally desirable for the PLL 200 to attenuate jitter noise. To attenuate 1 μs RMS jitter noise, the phase detector 212 should generally be linear for at least twice that, or 2 μs. For an XOR logic gate as the phase detector 212, the linear phase range is approximately one-half the period of the input signals, e.g., approximately 125 μs for two 4 kHz input signals.

The error signal of the phase detector 212 is provided to the digital counter 214. For one embodiment, the digital counter 214 is set to an initial value, such as zero, and is incremented in response to a sampling clock signal when the error signal has the first logic state indicative of phase error. For example, the digital counter 214 may be incremented in response to a trigger, such as each rising edge or, alternatively, each falling edge, of the sampling clock signal while the error signal has the first logic state. The count of the digital counter 214 is then passed or made available to the digital-to-analog converter 216 when the error signal transitions to the second logic state indicating that the reference clock signal and the feedback signal share the same phase state. Upon passing the count to the digital-to-analog converter 216, the digital counter 214 is again reset to its initial value. The count of the digital counter 214 passed to the digital-to-analog converter 216 is indicative of the duty cycle of the output of the phase detector 212 and, thus, the amount of phase error between the reference clock signal and the feedback signal provided to the phase detector 212. Increasing phase error results in increasing duty cycle and decreasing phase error results in decreasing duty cycle. Other methods of obtaining a count value indicative of the amount of phase error can be imagined, such as setting the digital counter 214 to a selected initial value (such as full value), decrementing during the time the error signal has the second logic state, and passing the count to the digital-to-analog converter 216 when the output of the phase detector 212 transitions to the first logic state.

The digital-to-analog converter 216 converts the count of the digital counter 214 into an error voltage signal for input to the filter 220. The error voltage signal is also indicative of the amount of phase error between the reference clock signal and the feedback signal provided to the phase detector 212 as it is directly proportional to the count value of the digital counter 214. While the initial value of the digital counter 214 was set to zero for this example, other initial values could be chosen; choosing non-zero initial values could be used to increase the resulting error voltage signal value for a given level of phase error.

The frequency of the sampling clock signal is preferably chosen to substantially match the resolution of the digital-to-analog converter 216, the resolution being the number of counts to move from a zero reference to a full reference output. Doing so facilitates a count value from the digital counter 214 that is directly proportional to the amount of phase error. For example, a 10-bit digital-to-analog converter 216 requires 1024 codes to move from a zero reference to a full reference output. Accordingly, the sampling clock signal preferably produces 1024 triggers within one period of the output of the phase detector 212 to permit accurate sampling of zero to 100% phase error. Assuming an 8 kHz output frequency from the phase detector 212, and the 10-bit digital-to-analog converter 216 of this example, the desired frequency of the sampling clock signal would be 1024×8 kHz, or 8.192 MHz. The more general relationship for the target frequency for the sampling clock signal in this case is the resolution of the digital-to-analog converter 216 times the output frequency of the phase detector 212.

Choosing a sampling clock signal frequency too low may result in an inability to drive the digital-to-analog converter 216 to its full reference value despite having 100% phase error. Likewise, choosing a sampling clock signal frequency too high may result in driving the digital-to-analog converter 216 to its full reference value despite having a phase error well below 100%. While there are advantages to matching the sampling clock signal frequency to the resolution of the digital-to-analog converter 216, such matching is not imperative. The frequency of the sampling clock signal must simply be within a range of the target frequency that permits counts from the digital counter 214 capable of controlling the VCXO 230 to produce a phase lock. When sufficiently near the target frequency, the frequency of the sampling clock signal merely sets the location of the "zero phase error" of the PLL 200, thus affecting the finite phase difference between the reference clock signal and the feedback signal, but still permitting the phases of the two signals to be locked. For one embodiment, the frequency of the sampling clock signal is within 10% of the target frequency, wherein the target frequency is a frequency matched to the resolution of the digital-to-analog converter 216.

For one embodiment, the sampling clock signal is produced from an external source, such as a microprocessor output, having a frequency of 39.6 MHz. The target frequency is 8.192 MHz as in the foregoing example. The external source frequency is divided by five to produce a 7.92 MHz sampling clock signal. Although the resulting frequency is 3.3% less than the target frequency, it has been shown to produce satisfactory operation.

The resolution of the digital counter 214 is also preferably chosen to match or exceed the resolution of the digital-to-analog converter 216. For one embodiment, the digital counter 214 has a resolution matching the resolution of the digital-to-analog converter 216, e.g., the digital counter 214 is a 10-bit digital counter when using a 10-bit digital-to-analog converter 216. For another embodiment, the digital counter 214 has a resolution exceeding the resolution of the digital-to-analog converter 216, e.g., a 10-bit digital-to-analog converter 216 is paired with a 12-bit digital counter 214. While matching or exceeding resolution of the digital-to-analog converter 216 is preferred, it is not imperative. A digital counter 214 having a resolution less than the resolution of the digital-to-analog converter 216 may be used where the resulting range of count values is capable of controlling the VCXO 230 to produce a phase lock. For one such embodiment, the digital counter 214 has a resolution less than the resolution of the digital-to-analog converter 216, e.g., a 12-bit digital-to-analog converter 216 is paired with a 10-bit digital counter 214 where a 10-bit count value produces a range of error voltage signal values from the 12-bit digital-to-analog converter 216 capable of controlling the VCXO 230 to produce a phase lock. For such an embodiment, the sampling clock signal frequency is preferably substantially matched to the device having the lowest resolution, i.e., the digital counter 214. In effect, the frequency of the sampling clock signal in this embodiment is also substantially matched to the digital-to-analog converter 216 as it is substantially matched to the usable range of the digital-to-analog converter 216, i.e., the range of error voltage signals corresponding to the range of count values of the digital counter 214.

An external reference clock signal may be passed through an optional frequency divider, such as divide-by-M block 205, prior to input to the phase comparator 210. If the external reference clock signal does not have a 50% duty cycle, operation of the phase detector 212 may suffer. Passing the external reference clock signal through a divide-by-M block 205, where M=2, may be used to produce a reference clock signal having an approximately 50% duty cycle, albeit at one-half the frequency of the external reference clock signal. Furthermore, where the VCXO 230 is designed to operate at a selected multiple N of the reference clock signal provided to the phase comparator 210, a frequency divider, such as divide-by-N block 240, is coupled in the feedback loop between the output of the VCXO 230 and the second input of the phase comparator 210. To continue the foregoing example, an external reference clock signal having a frequency of 8 kHz, such as a frame pulse of a building integrated timing supply (BITS) signal, is passed through a divide-by-two block 205 to produce a reference clock signal having a frequency of 4 kHz for input to the phase comparator 210. The VCXO 230 is designed to operate in a range of frequencies including 3.24 MHz as the target output frequency, or a multiple of 810 times the frequency of the reference clock signal input to the phase comparator 210. For this example, factor N becomes 810 to produce a feedback signal approaching and substantially matching the frequency of the reference clock signal. This division of the feedback signal frequency may occur in more than one step or more than one frequency divider. For example, the output of the VCXO 230 may be frequency divided to first match the external reference clock signal, with the resulting signal then further frequency divided by two to produce a feedback signal having an approximately 50% duty cycle and a frequency approaching the frequency of the reference clock signal. For this example, the output of the VCXO 230 would first be divided by 405 using a first frequency divider to match the external reference clock signal, then divided by two using a second frequency divider to produce a 4 kHz signal having a duty cycle of 50% for feedback to the phase comparator 210.

For one embodiment, the phase detector 212 is a three-state phase/frequency detector. The output error signal of a three-state phase/frequency phase detector contains an up output and a down output. The up output is representative of a phase lead between the reference signal and the feedback signal while the down output is representative of a phase lag between the reference signal and the feedback signal. The up output and down output may be the same output, i.e., the up output represented by a first logic state on the output of the phase detector 212 and the down output represented by a second logic state on the output of the phase detector 212. Alternatively, the up output may be physically separate from the down output, and phase lead or phase lag may be represented by a first logic state presented on either the up output or the down output, respectively. A true phase alignment may be represented by a high-impedance state if the up and down outputs are on the same output, or by a second logic state on both the up and down outputs if the up and down outputs are physically separate.

For this embodiment containing a three-state phase detector, the digital counter 214 should have an initial value, e.g., one-half its range, and should be incremented or decremented in response to the sampling clock signal in conjunction with the up or down output, respectively. A count enable signal is generated when the up and down output of the three-state phase detector are indicative of phase misalignment. For example, using physically separate up and down outputs, the outputs could be passed through an XOR logic gate to generate a count enable signal having a first, or high, logic state when exactly one of the up and down outputs has a high logic state, i.e., when there is phase lead or lag. When the count enable signal transitions to a second, or low, logic state, the count of the digital counter 214 is passed to the digital-to-analog converter 216 then the digital counter 214 is re-loaded with the initial value. To generate the count, the digital counter 214 is incremented in response to the sampling clock signal when the count enable signal is in its first logic state and the up output is its logic state representative of a phase lead. Alternatively, the digital counter 214 is decremented in response to the sampling clock signal when the count enable signal is in its first logic state and the down output is in its logic state representative of a phase lag. In this manner, the count value of the digital counter 214 is indicative of an amount of phase error between the reference clock signal and the feedback signal.

Figure 3:
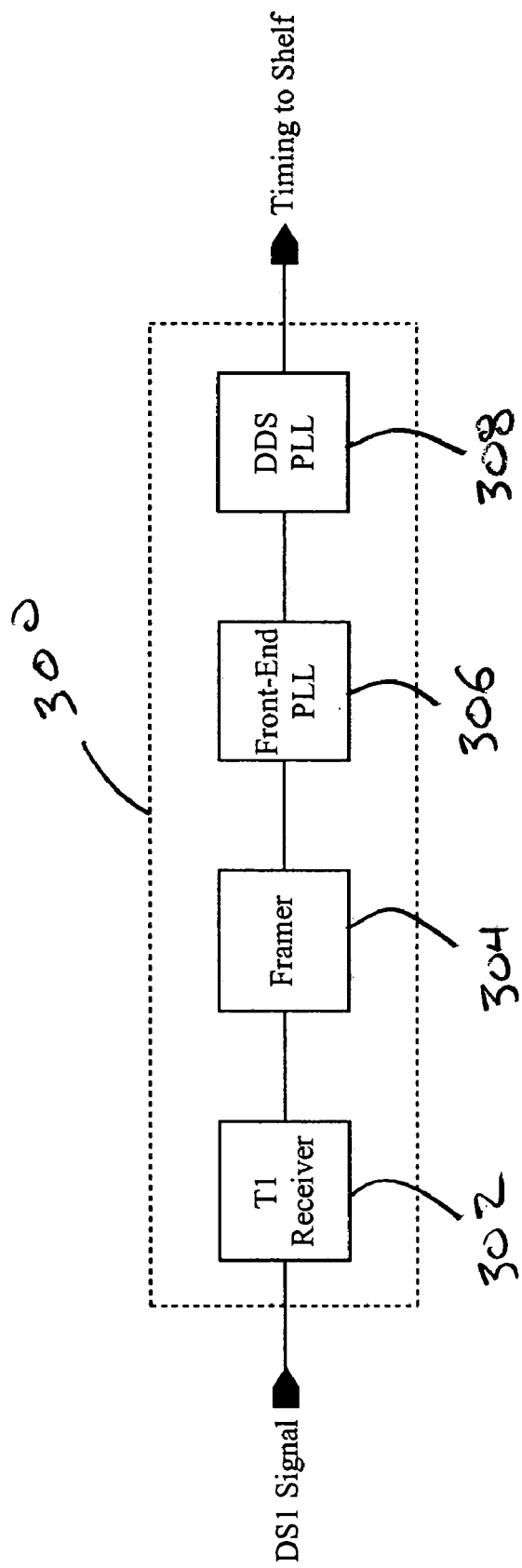
FIG. 3 is a block diagram of a timing circuit in accordance with an embodiment of the invention.

Phase locked loops of the type described above may find use in communications networks such as synchronous communications networks. As an example, PLLs in accordance with the various embodiments of the invention may form a portion of a timing circuit of a shelf controller. FIG. 3 is a block diagram of a timing circuit 300 including a T1 receiver 302 for receiving a communication signal, such as a DS1 signal, and recovering clock and data signals therefrom; a framer 304 for locating a frame pulse and generating the external reference clock signal from the recovered clock and data signals; a first or front-end PLL 306 in accordance with the foregoing embodiments for generating a first timing signal derived from the external reference clock signal; and a second PLL, such as a direct digital synthesizer PLL (DDS PLL) 308, for generating a second timing signal as a synchronization timing signal derived from the first timing signal. The synchronization timing signal is provided to a shelf backplane of a communications network element for synchronization of various shelf elements within the network element. The first PLL 306 is used in this embodiment for pre-scaling the input to the second PLL 308 to reduce noise effects on the synchronization timing signal. However, the first PLL 306 could be used to produce the synchronization timing signal directly, without the use of the second PLL 308.

Figure 4:
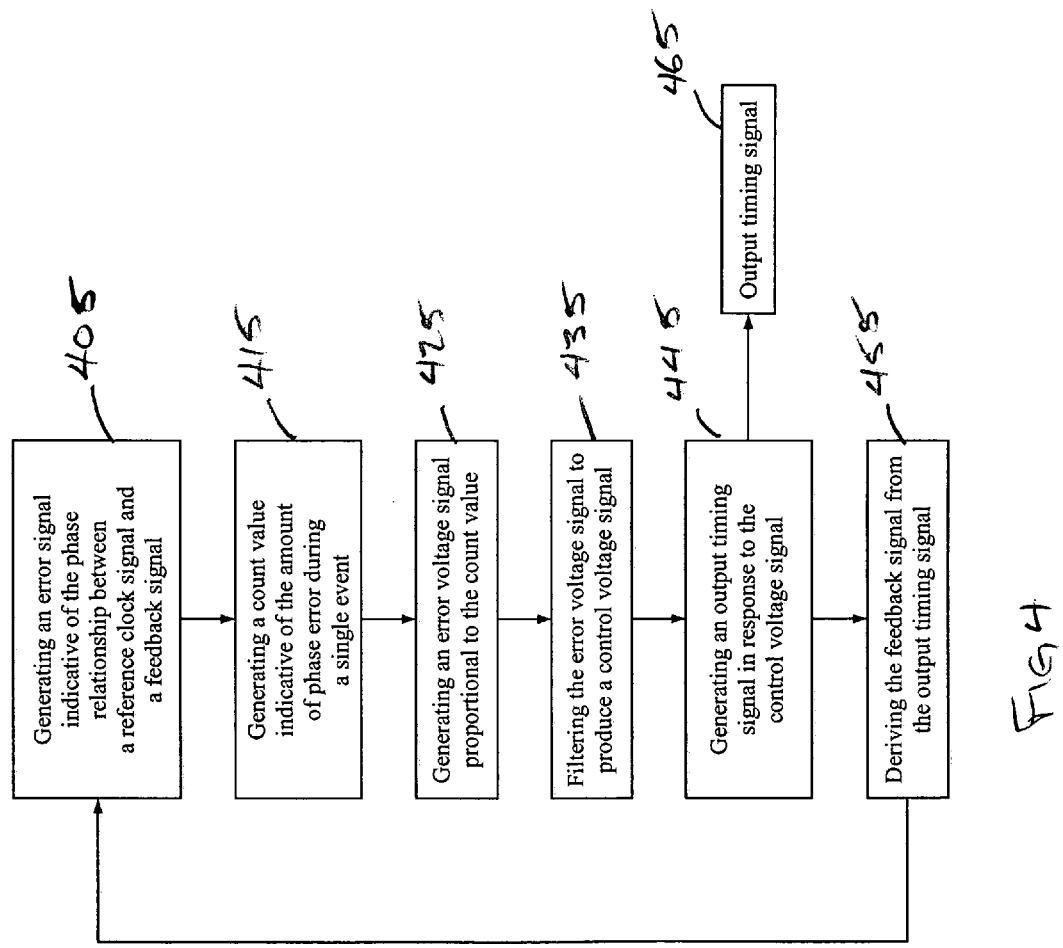
FIG. 4 is a flowchart of a method of generating a timing signal in accordance with an embodiment of the invention.

FIG. 4 is a flowchart of one embodiment of a method of generating a timing signal for use in the synchronization of communications within a synchronous communications network. An error signal indicative of the phase relationship between a reference clock signal and a feedback signal is generated at block 405. An example is the output of an XOR logic gate as the error signal where the reference clock signal and the feedback signal are the two input signals. The output error signal of an XOR logic gate has a logic low value when the two input signals share the same phase state, whether they are both logic high or logic low. The output error signal of an XOR logic gate further has a logic high value when either input signal has a logic high value while the remaining input signal has a logic low value. The output error signal of an XOR logic gate is thus indicative of phase relationship between the reference clock signal and the feedback signal.

A count value indicative of the amount of phase error during a single event is generated at block 415. For a two-state phase detector generating the error signal, the single event is a single period of the error signal and the count value may be thought of as a direct measurement of the duty cycle of the error signal. The duty cycle of an error signal generated by a two-state phase detector is directly proportional to the amount of phase error occurring during a single period of the error signal. Thus, the count value becomes a direct measurement of the amount of phase error. One process for generating such a count value includes applying a sampling clock signal and the error signal to a digital counter, and incrementing the counter for each trigger of the sampling clock signal during a time when the error signal is indicative of phase error between the reference clock signal and the feedback signal. For a three-state phase detector generating the error signal, the single event is a single period of the count enable signal.

An error voltage signal proportional to the count value is generated at block 425. One process for generating an error voltage signal proportional to the count value is through the use of a digital-to-analog converter. A digital-to-analog converter produces an output voltage in response to, and proportional to, a control word. The count value, i.e., the control word, is applied to the digital-to-analog converter to produce the error voltage signal proportional to the count value. The count value may be passed to the digital-to-analog converter in response to the error signal transitioning from a first logic state to a second logic state.

The error voltage signal is filtered at block 435 to produce a control voltage signal. Use of an active filter is preferred at this process stage to increase the gain in the phase locked loop. Filtering the error voltage signal produces a control voltage signal that is representative of an average error voltage signal and, thus, an average amount of phase error, over a period of time.

The timing signal is generated at block 445 in response to the control voltage signal. At steady state, the timing signal has a frequency that substantially matches a frequency of the reference clock signal, or a selected multiple of the frequency of the reference clock signal. One process for generating the timing signal is through the use of a voltage-controlled oscillator, such as a voltage-controlled crystal oscillator. Voltage-controlled oscillators may include push-pull oscillators, relaxation oscillators and ring oscillators. A voltage-controlled oscillator produces an oscillating signal in response to an externally-applied voltage. The timing signal may be output at block 465 directly for use in the synchronization of communications, or it may be used as a reference clock signal in a downstream phase locked loop for generation of a second or subsequent timing signal used in the synchronization of communications.

To facilitate locking of the phase of the timing signal to the phase of the reference clock signal, a feedback signal is derived from the timing signal at block 455 for application at block 405. The feedback signal has a frequency approaching the frequency of the reference clock signal and, when the phases are locked, has a frequency substantially equal to the frequency of the reference clock signal. Where the timing signal has a frequency that substantially matches a selected multiple of the frequency of the reference clock signal, the timing signal is frequency divided to derive the feedback signal having a frequency approaching the frequency of the reference clock signal.

Figure 5:
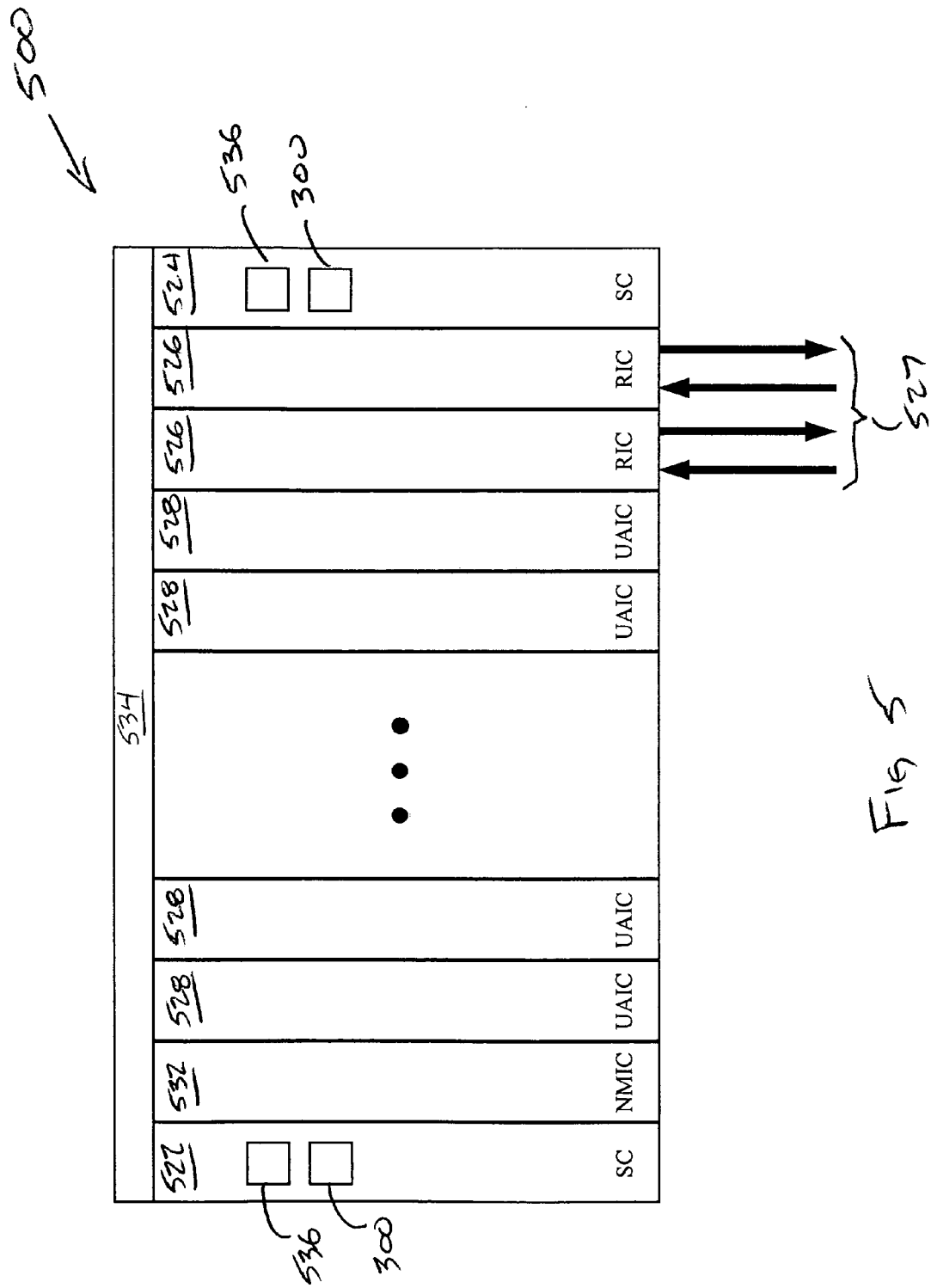
FIG. 5 is a block diagram of a network element in accordance with an embodiment of the invention.

FIG. 5 is a block diagram of a network element 500 in accordance with one embodiment of the invention containing first shelf controller 522 and second shelf controller 524 for redundant control of various shelf elements. The first, or primary, shelf controller 522 receives a primary building integrated timing supply (BITS) signal and a secondary BITS signal. The second, or redundant, shelf controller 524 also receives the primary and secondary BITS signals. The shelf controllers 522/524 each contain a timing circuit 300 and a processor 536 coupled to its associated timing circuit 300. At least one of the timing circuits 300 contains a PLL in accordance with the foregoing embodiments for generating a first timing signal from an external reference clock signal, wherein the external reference clock signal is obtained from any of the primary BITS signal, the secondary BITS signal, or a selected reference clock signal from one of the remaining shelf elements. The shelf elements may include ring interface cards 526 for redundant communications with other network elements through lines 527, and user access interface cards 528 for various user-interface functions to the network element 500 from a local area network (LAN). The shelf elements may further include other cards supporting such functions as network management, e.g., network management interface card (NMIC) 532. For one embodiment, the network element 500 contains 18 shelf elements including the two shelf controllers 522/524. Each shelf element is coupled to the shelf backplane 534 for distribution of the second timing signal and for communication among the various shelf elements, e.g., communication between a user access interface card 528 and a ring interface card 526 for carrying out communication to or from other network elements 500.

Figure 7:
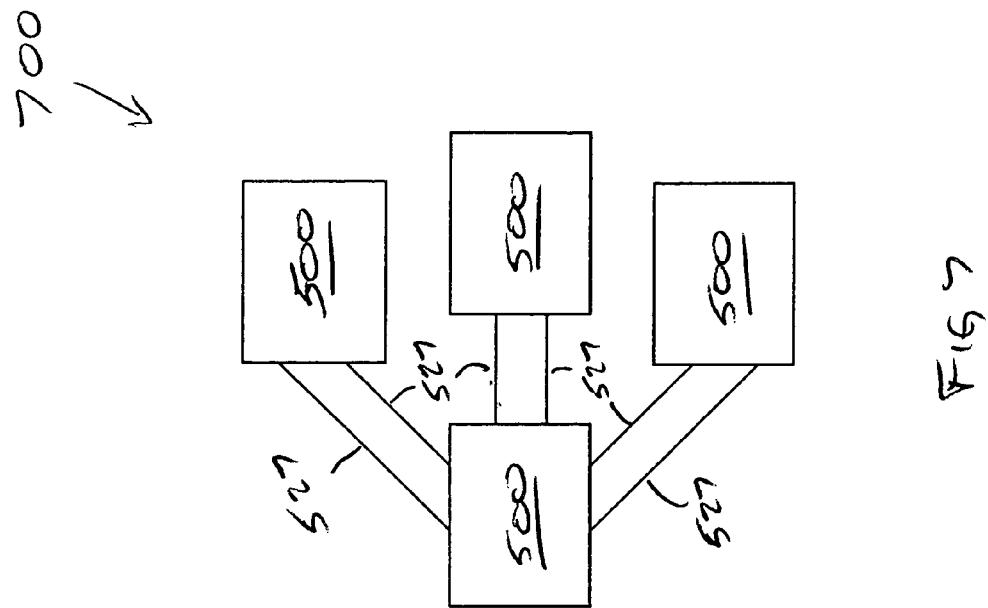
FIG. 7 is a block diagram of a network having a star configuration in accordance with an embodiment of the invention.
Figure 6:
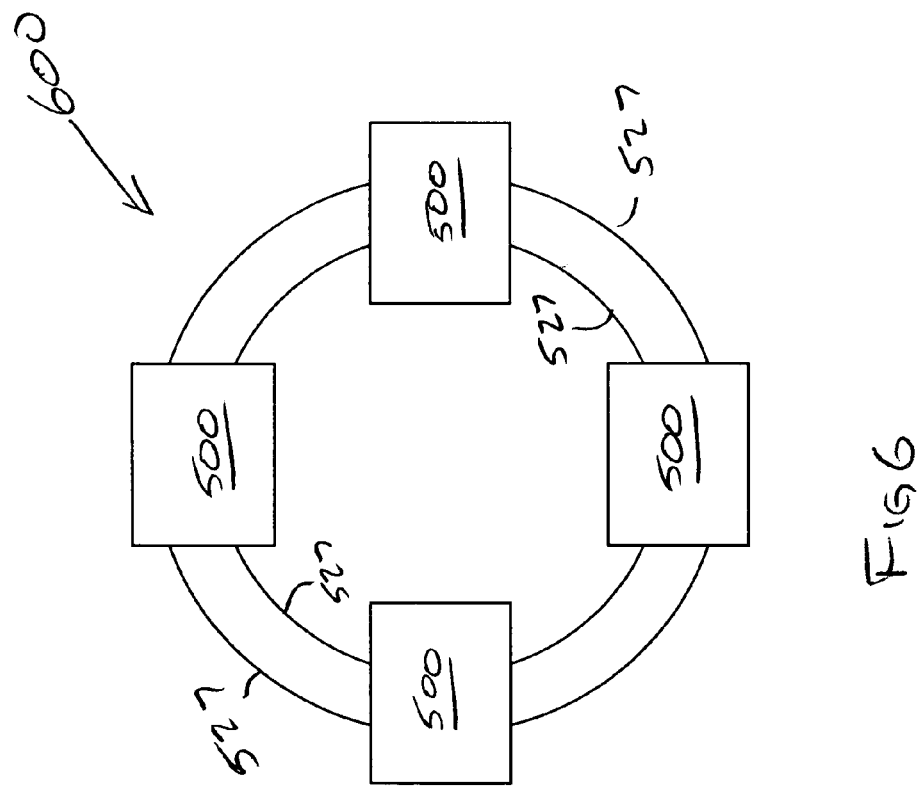
FIG. 6 is a block diagram of a network having a ring configuration in accordance with an embodiment of the invention.

FIG. 6 is a block diagram of a network 600 containing two or more network elements 500 in a ring configuration and having redundant I/O for each network element 500. At least one network element 500 of network 600 contains a PLL in accordance with the various embodiments of the invention. FIG. 7 is a block diagram of a network 700 containing two or more network elements 500 in a star configuration. At least one network element 500 of network 700 contains a PLL in accordance with the various embodiments of the invention.

CONCLUSION

Phase locked loops operable at low reference clock signal frequencies have been described. Phase locked loops in accordance with the invention include a phase comparator having a phase detector, a digital counter, and a digital-to-analog converter. Such phase comparators permit direct measurement of the amount of phase error prior to filtering and amplification by the phase locked loop. Direct measurement of the amount of phase error can be used to reduce the likelihood of saturating an amplifier of an active filter of the phase locked loop without the use of a pre-filter. Phase locked loops in accordance with the invention are suitable for use in timing circuits of communications systems for the synchronization of communications across such systems.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any such adaptations or variations of the invention. It is manifestly intended that this invention be limited only by the following claims and equivalents thereof.

What is claimed is:

1. A phase comparator, comprising:
   a phase detector having a first input for receiving a first signal, a second input for receiving a second signal, and an output for providing an error signal indicative of a phase relationship between the first signal and the second signal;
   a digital counter having a first input for receiving the error signal, a second input for receiving a sampling clock signal, and an output for providing a count value; and
   a digital-to-analog converter having an input for receiving the count value and an output for providing an error voltage signal.

2. The phase comparator of claim 1, wherein the phase detector is a two-state phase detector and wherein the error signal has a first logic state indicative of a phase error between the first signal and the second signal.

3. The phase comparator of claim 2, wherein the two-state phase detector is an XOR logic gate.

4. The phase comparator of claim 2, wherein the two-state phase detector is a two-state sequential phase detector.

5. The phase comparator of claim 1, wherein the phase detector is a three-state phase detector and wherein the error signal has a first output indicative of phase lead between the first signal and the second signal, and a second output indicative of phase lag between the first signal and the second signal.

6. The phase comparator of claim 1, wherein the sampling clock signal has a frequency that is substantially matched to a resolution of the digital-to-analog converter.

7. The phase comparator of claim 1, wherein the sampling clock signal has a frequency that is within 10% of a target frequency, wherein the target frequency is substantially matched to a resolution of the digital-to-analog converter.

8. The phase comparator of claim 1, wherein the sampling clock signal has a frequency that is substantially matched to a resolution of the digital counter.

9. The phase comparator of claim 1, wherein the digital counter has a resolution that matches or exceeds a resolution of the digital-to-analog converter.

10. A phase locked loop, comprising:
a phase comparator, comprising:
a phase detector having a first input for receiving a first reference clock signal, a second input for receiving a feedback signal, and an output for providing an error signal;
a digital counter having a first input for receiving the error signal, a second input for receiving a sampling clock signal, and an output for providing a count value; and
a digital-to-analog converter having an input for receiving the count value and an output for providing an error voltage signal;
a filter having an input for receiving the error voltage signal and an output for providing a control voltage signal; and
a voltage-controlled oscillator having an input for receiving the control voltage signal and an output for providing an output signal, wherein the feedback signal is derived from the output signal.

11. The phase locked loop of claim 10, wherein the phase detector is a two-state phase detector.

12. The phase locked loop of claim 11, wherein the two-state phase detector is an XOR logic gate.

13. The phase locked loop of claim 11, wherein the two-state phase detector is a two-state sequential phase detector.

14. The phase locked loop of claim 10, wherein the phase detector is a three-state phase/frequency phase detector.

15. The phase locked loop of claim 10, wherein the sampling clock signal has a frequency that is substantially matched to a resolution of the digital-to-analog converter.

16. The phase locked loop of claim 10, wherein the sampling clock signal has a frequency that is within 10% of a target frequency, wherein the target frequency is substantially matched to a resolution of the digital-to-analog converter.

17. The phase locked loop of claim 10, wherein the sampling clock signal has a frequency that is substantially matched to a resolution of the digital counter.

18. The phase locked loop of claim 10 wherein the digital counter has a resolution that matches or exceeds a resolution of the digital-to-analog converter.

19. The phase locked loop of claim 10 wherein the filter further comprises an active filter.

20. The phase locked loop of claim 10 wherein the voltage-controlled oscillator is a voltage-controlled crystal oscillator.

21. The phase locked loop of claim 10 wherein the feedback signal is the output signal of the voltage-controlled oscillator.

22. The phase locked loop of claim 10 further comprising a frequency divider coupled between the output of the voltage-controlled oscillator and the second input of the phase detector, wherein the frequency divider comprises a divide-by-N block and wherein a target frequency of the output signal of the voltage-controlled oscillator is approximately N times a frequency of the first reference clock signal.

23. The phase locked loop of claim 10 further comprising:
a frequency divider having an input for receiving a second reference clock signal and an output for providing the first reference clock signal as a selected fraction of the second reference clock signal.

24. The phase locked loop of claim 23, wherein the frequency divider comprises a divide-by-two block, thereby producing a first reference clock signal having a 50% duty cycle and a frequency of approximately one-half of a frequency of the second reference clock signal.

25. A method of generating a timing signal, comprising:
generating an error signal indicative of a phase relationship between a reference clock signal and a feedback signal;
generating a sampling clock signal to define a plurality of sampling intervals;
adjusting a value of a counter during sampling intervals for a single event based on the sampling clock to produce a value indicative of an amount of phase error during the single event;
generating an error voltage signal proportional to the count value;
generating the timing signal in response to the error voltage signal; and
deriving the feedback signal from the timing signal.

26. A method of generating a timing signal, comprising:
generating an error signal indicative of a phase relationship between a reference clock signal and a feedback signal;
generating a count value indicative of an amount of phase error during a single event;
generating an error voltage signal proportional to the count value;
filtering the error voltage signal to produce a control voltage signal;
generating the timing signal in response to the control voltage signal; and
deriving the feedback signal from the timing signal.

27. The method of claim 26, wherein generating an error signal comprises generating an error signal with a two-state phase detector and wherein the single event comprises a single period of the error signal.

28. The method of claim 27, wherein generating a count value comprises incrementing a digital counter in response to a sampling clock signal during a time when the error signal has a first logic state and wherein generating an error voltage occurs at a time when the error signal transitions from the first logic state to a second logic state.

29. The method of claim 26, wherein generating the timing signal comprises applying the control voltage to a voltage-controlled oscillator.

30. The method of claim 26, wherein deriving the feedback signal from the timing signal comprises dividing the feedback signal by a selected factor N, wherein the timing signal has a target frequency of approximately N times a frequency of the reference clock signal.

31. A method of generating a timing signal, comprising:
generating an error signal indicative of a phase relationship between a reference clock signal and a feedback signal, wherein the error signal has a first logic state indicative of phase error between the reference clock signal and the feedback signal and a second logic state indicative of the reference clock signal and the feedback signal sharing the same phase state;
generating a count value indicative of an amount of phase error during a single period of the error signal;
generating an error voltage signal proportional to the count value;
filtering the error voltage signal to produce a control voltage signal;
generating the timing signal in response to the control voltage signal; and
deriving the feedback signal from the timing signal.

32. A network element for a communications network, the network element comprising:

a shelf backplane; and a plurality of shelf elements coupled to the shelf backplane, wherein the plurality of shelf elements includes at least one shelf controller for controlling synchronization of the plurality of shelf elements, the at least one shelf controller comprising:

a processor; and a timing circuit coupled to the processor, wherein the timing circuit comprises:

a phase locked loop, comprising:

a phase comparator, comprising:

a phase detector having a first input for receiving a reference clock signal, a second input for receiving a feedback signal, and an output for providing an error signal;

a digital counter having a first input for receiving the error signal, a second input for receiving a sampling clock signal from the processor, and an output for providing a count value; and a digital-to-analog converter having an input for receiving the count value and an output for providing an error voltage signal; and a voltage-controlled oscillator having an input coupled to receive the error voltage signal and an output;

wherein the timing circuit provides a synchronization timing signal to the shelf backplane for the synchronization of the plurality of shelf elements; and wherein the synchronization timing signal is derived from the output of the voltage-controlled oscillator.

33. A phase locked loop, comprising:

a first frequency divider having an input for receiving a first reference clock signal and an output for providing a second reference clock signal;

a phase comparator, comprising:

a two-state phase detector having a first input for receiving the second reference clock signal, a second input for receiving a feedback signal, and an output for providing an error signal indicative of a phase relationship between the second reference clock signal and the feedback signal;

a digital counter having a first input for receiving the error signal, a second input for receiving a sampling clock signal, and an output for providing a count value, wherein the count value is indicative of an amount of phase error during a single period of the error signal; and a digital-to-analog converter having an input for receiving the count value and an output for providing an error voltage signal proportional to the count value;

an active filter having an input for receiving the error voltage signal and an output for providing a control voltage signal, wherein the control voltage signal is representative of an average value of the error voltage signal during a period of time;

a voltage-controlled oscillator having an input for receiving the control voltage signal and an output for providing an output signal, wherein the output signal is an oscillating signal proportional to the control voltage signal; and a second frequency divider having an input for receiving the output signal and an output for providing the feedback signal, wherein the feedback signal has a frequency approaching a frequency of the second reference clock signal.

34. The phase locked loop of claim 33, wherein the two-state phase detector is an XOR logic gate.

35. The phase locked loop of claim 33, wherein the two-state phase detector is a two-state sequential phase detector.

36. The phase locked loop of claim 33, wherein the sampling clock signal has a frequency that is substantially matched to a resolution of the digital-to-analog converter.

37. The phase locked loop of claim 33, wherein the voltage-controlled oscillator is a voltage-controlled crystal oscillator.

38. The phase locked loop of claim 33, wherein the first frequency divider comprises a divide-by-two block, thereby producing the second reference clock signal having a 50% duty cycle and a frequency of approximately one-half of a frequency of the first reference clock signal.

39. The phase locked loop of claim 38, wherein the output signal of the voltage-controlled oscillator has a frequency that is a selected multiple N of the frequency of the first reference clock signal, and wherein the second frequency divider comprises a divide-by-N block followed by a divide-by-two block, thereby producing the feedback signal having a 50% duty cycle and a frequency approaching the frequency of the second reference clock signal.

40. A method of generating a timing signal, comprising:

frequency dividing a first reference clock signal by a factor of two, thereby producing a second reference clock signal having a duty cycle of approximately 50% and a frequency of approximately one-half a frequency of the first reference clock signal;

generating an error signal indicative of a phase relationship between the second reference clock signal and a feedback signal using a two-state phase detector;

generating a count value indicative of an amount of phase error during a single period of the error signal by incrementing a digital counter in response to a sampling clock signal during a time when the error signal has a first logic state;

passing the count value to a digital-to-analog converter at a time when the error signal transitions from the first logic state to a second logic state;

resetting the digital counter to a selected initial value subsequent to passing the count value;

generating an error voltage signal proportional to the count value using the digital-to-analog converter, filtering the error voltage signal using an active filter to produce a control voltage signal representative of an amplified average error voltage signal;

supplying the control voltage signal to a voltage-controlled oscillator to generate the timing signal; and frequency dividing the timing signal to derive the feedback signal.

41. The method of claim 40, wherein frequency dividing the timing signal comprises first dividing the timing signal by a selected factor N, wherein the timing signal has a target frequency of approximately N times a frequency of the first reference clock signal, then dividing the resulting signal by a factor of two, thereby producing a feedback signal having a duty cycle of approximately 50% and a frequency approaching the frequency of the second reference clock signal.

42. A shelf controller for controlling synchronization of shelf elements in a communications network element, the shelf controller comprising:

a processor; and a timing circuit coupled to the processor, wherein the timing circuit comprises:

a phase locked loop, comprising:
  a phase comparator, comprising:
    a phase detector having a first input for receiving a reference clock signal, a second input for receiving a feedback signal, and an output for providing an error signal;
    a digital counter having a first input for receiving the error signal, a second input for receiving a sampling clock signal from the processor, and an output for providing a count value; and
    a digital-to-analog converter having an input for receiving the count value and an output for providing an error voltage signal; and
  a voltage-controlled oscillator having an input coupled to receive the error voltage signal and an output for providing a synchronization timing signal for the synchronization of the shelf elements, wherein the feedback signal is derived from the output of the voltage-controlled oscillator.

43. A method of generating a timing signal, comprising:
generating an error signal indicative of a phase relationship between a reference clock signal and a feedback signal using a three-state phase detector, wherein the error signal includes an up output and a down output;
generating a count value indicative of an amount of phase error during a single event, wherein the single event is a period between a rising edge of the reference clock signal and a next rising edge of the feedback signal when the up output is indicative of phase lead between the reference clock signal and the feedback signal and wherein the single event is a period between a rising edge of the feedback signal and a next rising edge of the reference clock signal when the down output is indicative of phase lag between the reference clock signal and the feedback signal;
generating an error voltage signal proportional to the count value;
filtering the error voltage signal to produce a control voltage signal;
generating the timing signal in response to the control voltage signal; and
deriving the feedback signal from the timing signal.

44. The method of claim 43, wherein generating a count value indicative of an amount of phase error further comprises setting a digital counter to an initial value and incrementing the digital counter in response to a sampling clock signal during the single event when the up output is indicative of phase lead between the reference clock signal and the feedback signal and setting the digital counter to the initial value and decrementing the digital counter in response to the sampling clock signal during the single event when the down output is indicative of phase lag between the reference clock signal and the feedback signal.

45. A shelf controller for controlling synchronization of shelf elements in a communications network element, the shelf controller comprising:
  a processor; and
  a timing circuit coupled to the processor, wherein the timing circuit comprises:
    a phase locked loop, comprising:
      a phase comparator, comprising:
        a phase detector having a first input for receiving a reference clock signal, a second input for receiving a feedback signal, and an output for providing an error signal;
        a digital counter having a first input for receiving the error signal, a second input for receiving a sampling clock signal from the processor, and an output for providing a count value; and
        a digital-to-analog converter having an input for receiving the count value and an output for providing an error voltage signal;
      a filter having an input for receiving the error voltage signal and an output for providing a control voltage signal; and
      a voltage-controlled oscillator having an input for receiving the control voltage signal and an output for providing a synchronization timing signal for the synchronization of the shelf elements, wherein the feedback signal is derived from the output of the voltage-controlled oscillator.

46. The shelf controller of claim 45, wherein the sampling clock signal has a frequency that is substantially matched to a resolution of the digital-to-analog converter.

47. The shelf controller of claim 45, wherein the sampling clock signal has a frequency that is within 10% of a target frequency, wherein the target frequency is substantially matched to a resolution of the digital-to-analog converter.

48. The shelf controller of claim 45, wherein the sampling clock signal has a frequency that is substantially matched to a resolution of the digital counter.

49. The shelf controller of claim 45 wherein the digital counter has a resolution that matches or exceeds a resolution of the digital-to-analog converter.

50. A network element for a communications network, the network element comprising:
  a shelf backplane; and
  a plurality of shelf elements coupled to the shelf backplane, wherein the plurality of shelf elements includes at least one shelf controller for controlling synchronization of the plurality of shelf elements, the at least one shelf controller comprising:
    a processor; and
    a timing circuit coupled to the processor, wherein the timing circuit comprises:
      a phase locked loop, comprising:
        a phase comparator, comprising:
          a phase detector having a first input for receiving a reference clock signal, a second input for receiving a feedback signal, and an output for providing an error signal;
          a digital counter having a first input for receiving the error signal, a second input for receiving a sampling clock signal from the processor, and an output for providing a count value; and
          a digital-to-analog converter having an input for receiving the count value and an output for providing an error voltage signal;
        a filter having an input for receiving the error voltage signal and an output for providing a control voltage signal; and
        a voltage-controlled oscillator having an input for receiving the control voltage signal and an output;
  wherein the timing circuit provides a synchronization timing signal to the shelf backplane for the synchronization of the plurality of shelf elements; and
  wherein the synchronization timing signal is derived from the output of the voltage-controlled oscillator.

51. The network element of claim 50, wherein the sampling clock signal has a frequency that is within 10% of a target frequency, wherein the target frequency is substantially matched to a resolution of the digital-to-analog converter.

52. The network element of claim 50, wherein the sampling clock signal has a frequency that is substantially matched to a resolution of the digital counter.

53. The network element of claim 50 wherein the digital counter has a resolution that matches or exceeds a resolution of the digital-to-analog converter.

54. The network element of claim 50, wherein the sampling clock signal has a frequency that is substantially matched to a resolution of the digital-to-analog converter.

55. A shelf controller for controlling synchronization of shelf elements in a communications network element, the shelf controller comprising:
   a processor; and
   a timing circuit coupled to the processor, wherein the timing circuit comprises:
      a first phase locked loop, comprising:
         a phase comparator, comprising:
            a phase detector having a first input for receiving a first reference clock signal, a second input for receiving a feedback signal, and an output for providing an error signal;
            a digital counter having a first input for receiving the error signal, a second input for receiving a sampling clock signal from the processor, and an output for providing a count value; and
            a digital-to-analog converter having an input for receiving the count value and an output for providing an error voltage signal;
         a filter having an input for receiving the error voltage signal and an output for providing a control voltage signal; and
         a voltage-controlled oscillator having an input for receiving the control voltage signal and an output for providing a second reference clock signal, wherein the feedback signal is derived from the second reference clock signal; and
      a second phase locked loop having an input for receiving the second reference clock signal and an output for providing a synchronization timing signal for the synchronization of the shelf elements, wherein the synchronization timing signal is derived from the second reference clock signal.

56. The shelf controller of claim 55, wherein the sampling clock signal has a frequency that is substantially matched to a resolution of the digital counter.

57. The shelf controller of claim 55 wherein the digital counter has a resolution that matches or exceeds a resolution of the digital-to-analog converter.

58. The shelf controller of claim 55, wherein the sampling clock signal has a frequency that is substantially matched to a resolution of the digital-to-analog converter.

59. The shelf controller of claim 55, wherein the sampling clock signal has a frequency that is within 10% of a target frequency, wherein the target frequency is substantially matched to a resolution of the digital-to-analog converter.

60. A network element for a communications network, the network element comprising:
   a shelf backplane; and
   a plurality of shelf elements coupled to the shelf backplane, wherein the plurality of shelf elements includes at least one shelf controller for controlling synchronization of the plurality of shelf elements, the at least one shelf controller comprising:
      a processor; and
      a timing circuit coupled to the processor, wherein the timing circuit comprises:
         a framer having an input for receiving recovered clock and data signals of a communication signal and an output for providing a first reference clock signal;
         a first phase locked loop, comprising:
            a phase comparator, comprising:
               a phase detector having a first input for receiving the first reference clock signal, a second input for receiving a feedback signal, and an output for providing an error signal;
               a digital counter having a first input for receiving the error signal, a second input for receiving a sampling clock signal from the processor, and an output for providing a count value; and
               a digital-to-analog converter having an input for receiving the count value and an output for providing an error voltage signal;
            a filter having an input for receiving the error voltage signal and an output for providing a control voltage signal; and
            a voltage-controlled oscillator having an input for receiving the control voltage signal and an output for providing a second reference clock signal, wherein the feedback signal is derived from the second reference clock signal; and
         a second phase locked loop having an input for receiving the second reference clock signal and an output for providing a synchronization timing signal to the shelf backplane for the synchronization of the plurality of shelf elements, wherein the synchronization timing signal is derived from the second reference clock signal.

61. The network element of claim 55 wherein the digital counter has a resolution that matches or exceeds a resolution of the digital-to-analog converter.

62. The network element of claim 55, wherein the sampling clock signal has a frequency that is substantially matched to a resolution of the digital-to-analog converter.

63. The network element of claim 55, wherein the sampling clock signal has a frequency that is within 10% of a target frequency, wherein the target frequency is substantially matched to a resolution of the digital-to-analog converter.

64. The network element of claim 55, wherein the sampling clock signal has a frequency that is substantially matched to a resolution of the digital counter.

65. A method of generating a timing signal, comprising:
   generating an error signal indicative of a phase relationship between a reference clock signal and a feedback signal;
   adjusting a value of a counter a plurality of times during a single event to produce a value indicative of an amount of phase error during the single event;
   generating an error voltage signal proportional to the count value;
   generating the timing signal in response to the error voltage signal; and
   deriving the feedback signal from the timing signal.

66. The method of claim 65, wherein adjusting a value of the counter a plurality of times comprises adjusting the counter using a sampling clock signal.

* * * * *